United States Patent [19]

Shiragasawa et al.

[11] Patent Number: 4,736,159

[45] Date of Patent: Apr. 5, 1988

[54] LASER PROBING FOR SOLID-STATE DEVICE

[75] Inventors: Tsuyoshi Shiragasawa; Masaharu Noyori, both of Neyagawa, Japan

[73] Assignee: Matsushita Electric Industrial Co., Ltd., Kadoma, Japan

[21] Appl. No.: 800,741

[22] Filed: Nov. 20, 1985

[30] Foreign Application Priority Data

May 21, 1985 [JP] Japan ............................. 60-108828

[51] Int. Cl.[4] ................. G01R 31/26; G01R 31/28; G06R 9/00

[52] U.S. Cl. ........................... 324/158 R; 324/158 D; 382/8

[58] Field of Search .......... 324/73 PC, 158 R, 158 D; 382/8, 34; 358/106, 107; 356/394; 371/25

[56] References Cited

U.S. PATENT DOCUMENTS 4,178,064 12/1979 Mrdjen ............................. 250/235
4,479,145 10/1984 Azuma et al. ..................... 358/106

OTHER PUBLICATIONS

Nasashi Nagase; "Device Analysis System Based on Laser Scanning Techniques"; Microelectron. Reliab., vol. 20, pp. 717-735; 1980.

Tsujiyama et al; "A Highly Reliable Mask Inspection System"; IEEE Transaction on Electron Device; vol. Ed 27, No. 7; Jul. 1980; pp. 1284-1290.

Translation of "Failure Analysis for LSIs Using a Laser Probe", A Device Analysis System Based on Laser Scanning Techniques by Shiragasawa et al.

*Primary Examiner*—Ernest F. Karlsen
*Assistant Examiner*—Vinh P. Nguyen
*Attorney, Agent, or Firm*—Cushman, Darby & Cushman

[57] ABSTRACT

In laser probing of LSI, PICs' (photo-induced currents) are measured at the power source terminal of the LSI, under scanning of laser beam for a good LSI and a fault LSI, the measured PICs' are then superposingly displayed as red and green images, respectively; then faults of LSI are displayed as red spots in a yellow image made by superposition of green and red images.

33 Claims, 10 Drawing Sheets

F I G. 10
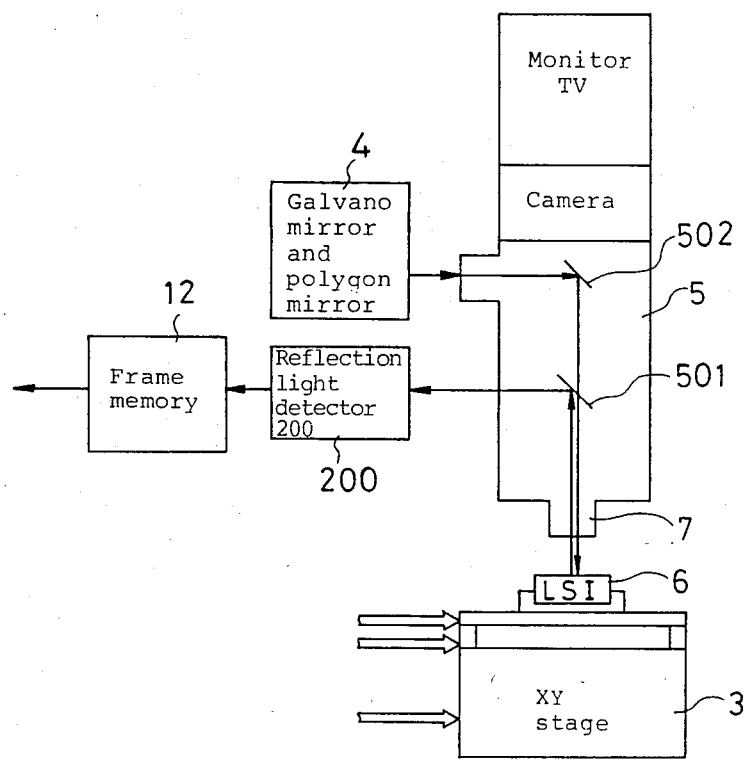

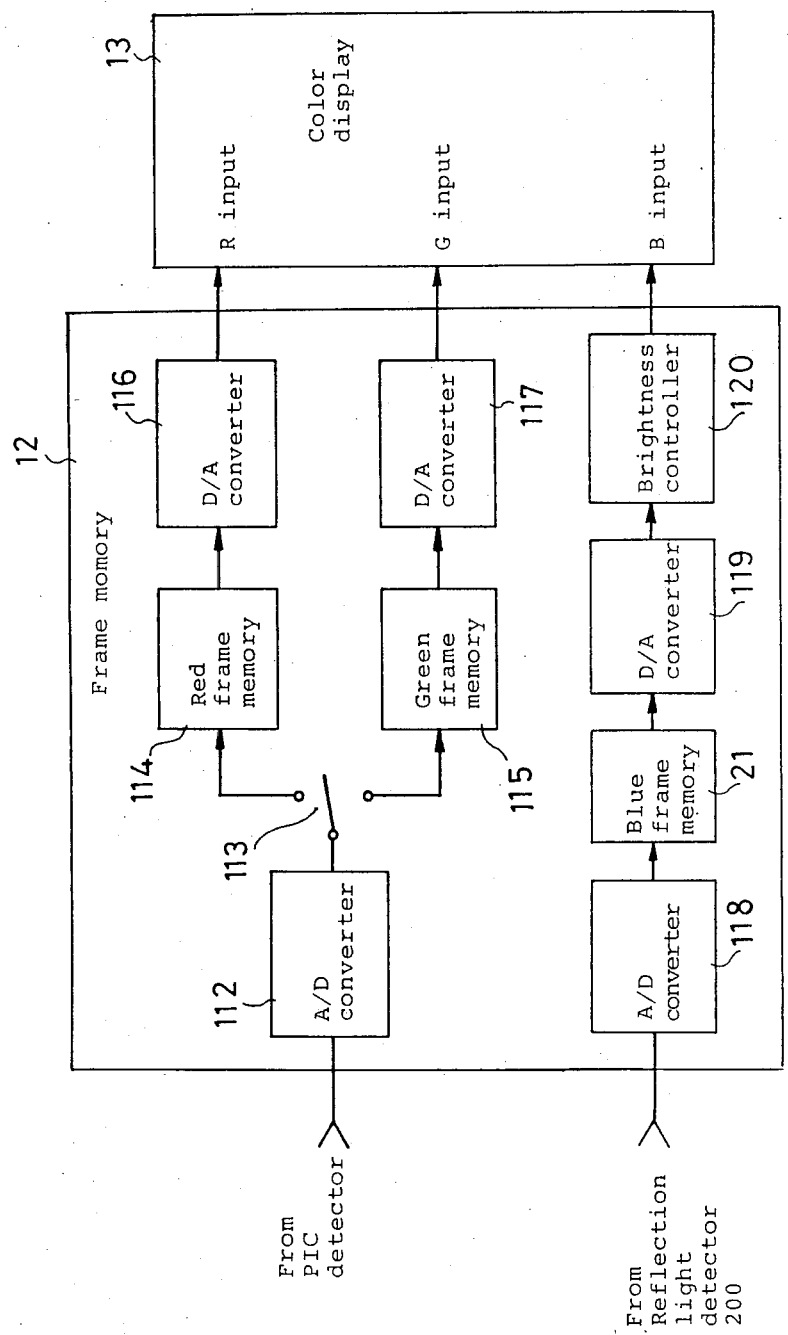
F I G. 11

LASER PROBING FOR SOLID-STATE DEVICE

FIELD OF THE INVENTION AND RELATED ART STATEMENT

1. Field of the Invention

The present invention relates generally to a laser probing technique for solid-state device, and particularly to a laser probing method for diagnosis of solid-state device by using a display image of the solid-state device which represents electric states of various parts of the solid-state device, thereby enabling quick and easy analysis of a large scale LSI.

2. Description of the Related Art

As the scale of integration of the solid-state LSI becomes larger, analysis by electric measures using electric current or voltage obtained from output terminals of the LSI for diagnosis becomes more difficult, and there is a great demand for a novel method to more effectively observe the electric states in the internal circuit of LSI by direct observation, possibly on a visual display apparatus or the like.

Hitherto, to examine or check the internal electric states of an LSI device was made by electric measurement by mechanically touching probe needles on various spots of the metal wiring pattern on the LSI. However, such technique becomes more and more difficult as the scale of integration of LSI becomes larger and larger, and hence the pattern becomes finer and finer, an accurate touching to necessary points by the probe needles becomes very difficult, and such technology is already out of date.

Recently, analysis of internal states of LSI by irradiating a finely focussed laser beam on the surface of LSI has been proposed (by Nagase: "Device analysis based on laser scanning techniques", Electronics and Communication Academy, Semiconductor-transistor Study Conference, SSD 79-56). This method uses a LSI surface which is scanned by a finely focussed laser beam, and photo-induced current appearing at power source terminals of the LSI is used for brightness modulation, and a brightness-modulated signal is displayed with correspondence to the LSI pattern, and the method has a feature that internal states of the LSI can be analyzed without touching thereto.

However, when a fault analysis of the LSI is made by the above-mentioned method, since the display is only for the pattern based on the photo-induced current, finding of the fault by using the display requires detailed knowledge of LSI pattern arrangements and electric operation thereof. Therefore, only a limited class of highly skilled persons can analyze the fault in the LSI by the above-mentioned method. Furthermore, in case of a complicated LSI of a large scale, it becomes very difficult to judge, using the above-mentioned, method how the brightness modulated image corresponds to electric states, and what type of display shows right and wrong spots in the LSI.

OBJECT AND SUMMARY OF THE INVENTION

The object of the present invention is to provide a useful and easily applicable method of analyzing what parts of LSI are making maloperation.

Further object of the present invention is to provide a method whereby maloperating parts of the LSI with fault can be easily found and confirmed.

By using the method in accordance with the present invention, even for a person who has no special knowledge about internal circuitry of LSI nor pattern disposition of LSI can easily judge good or bad of a specified part of the LSI, thereby to detect fault spots of the LSI.

The laser probing for solid-state device in accordance with the present invention comprises the steps of:

irradiating a laser light beam as a first irradiation on desired regions of a semiconductor device to be examined, producing a first image of a first color basing on a first PIC induced by the first irradiation of laser light beam on the desired regions, irradiating a laser light beam as a second irradiation on the corresponding regions of a reference solid-state device of substantially the same constitution, producing a second image of a second color basing on a second PIC induced by the second irradiation of laser light beam on the corresponding regions, superposingly displaying the first image and the second image in a manner that the image of the corresponding regions are superposed each other, thereby to produce spot images of either of the first or second color only for such regions on the solid-state device that the first current and the second current differ each other therein, while color of display for other regions from the such regions on the solid-state device are of a composite color of the first color and the second color.

When the above-mentioned steps are carried out, since the first image basing on a first PIC on a solid-state device to be examined and the second image basing on the second current on the reference solid-state device are of the same LSI pattern, if the first semiconductor device has a right operation, the image of the first semiconductor device and the image of the second semiconductor device become the same each other, and the superposingly displayed images become an image of a composite color made of the first color of the first display and the second color of the second display. And, if there is some defective part in the first LSI, the first image becomes different from the second image at that point, and therefore the defective part has different color from other parts of the LSI on the superposingly displayed image. Therefore, by finding points of such different color on the superposingly displayed image, defective regions of the LSI can be easily found.

BRIEF DESCRIPTION OF THE DRAWING

FIG. 10 is a schematic sectional view of a part of microscope and related part of a second embodiment of the present invention.

FIG. 11 is a block diagram of a frame memory 12 of the second embodiment of a semiconductor examining apparatus in accordance with the present invention to be used with a modified microscope shown in FIG. 10.

DESCRIPTION OF THE PREFERRED EMBODIMENTS

Figure 1:
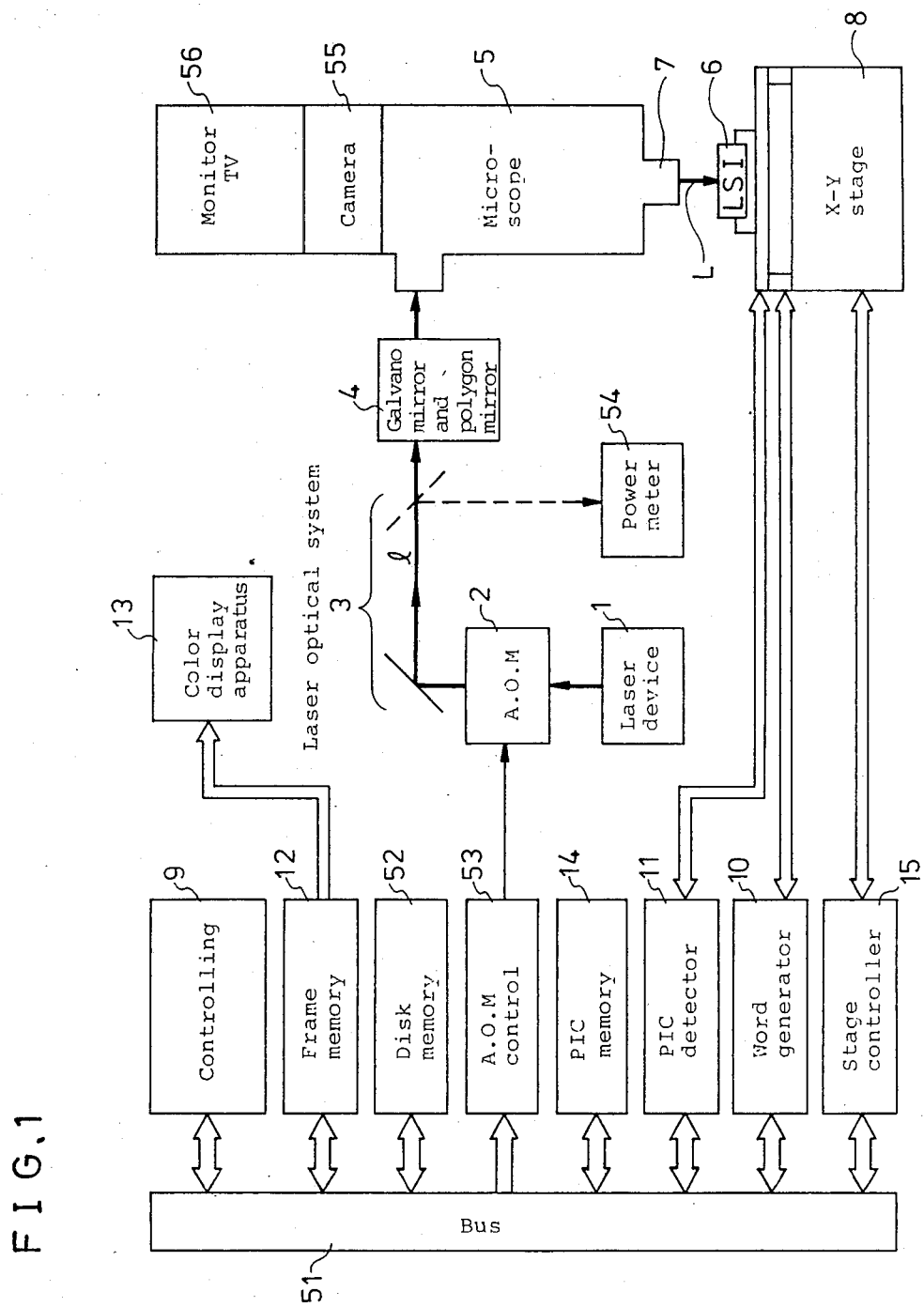
FIG. 1 is a block diagram of a semiconductor examining apparatus for use in carrying out laser probing for semiconductor device in accordance with the present invention.

First, a examining apparatus for carrying out the method of present invention is described with reference to FIGS. 1, 2, 3 and 4.

A laser device 1, for instance, a He-Ne laser emits a laser light, which is led through an AOM (acousto-optic modulator) 2, for controlling intensity of light and switching on and off. After passing through a laser optical system 3 and scanning device comprising a galvano mirror and a polygon mirror 4, the light is led to a microscope 5. The laser light 1 is focussed into a fine laser beam L when emitted from an objective lens 7 of the microscope 5 and irradiates the surface of an LSI 6. A diameter of a spot of the laser beam L on the LSI 6 is dependent on a magnifying factor of the objective lens 7, and in the embodiment the spot diameter of about 1 μm was obtained. The LSI 6 is placed on an X-Y stage 8. An LSI 6 which is perfectly made without defects thereon is hereafter called a reference LSI, and an LSI of which an effect or defects are to be detected by the method of the present invention is hereafter referred to as an object LSI. The reference LSI and the object LSI have the same pattern and same circuit constitution.

With respect to mechanical and optical configuration of the above-mentioned system, two mechanisms are provided for emitting the finely focussed laser beam L on arbitrarily desired position on the LSI 6. The first mechanism is the X-Y galvano-mirror 4 which drives the laser spot in the X direction and Y direction, thereby to irradiate a limited small area of the LSI by the laser beam. The small limited area is determined by an observation field of the microscope. Accordingly, when an ordinary objective lens is used, it is impossible to cover the whole area of the LSI. Therefore, the system of FIG. 1 is further provided with the X-Y stage 8 which drives the LSI 16 in the X direction and Y direction, so that any arbitrary position on the LSI 16 can be placed in the observation field of the microscope 5. For instance, the displacement ranges in X direction and Y direction of the X-Y stage 8 was ±50 mm.

When analysis of an LSI is carried out, an application of input signal for electric testing becomes necessary. As a measure for such application of the input signal, the present system utilizes such a measure that test input data are stored in data memory of a word generator 10 controlled by a controlling computer 9, and the data is read out and impressed on the LSI 6.

The system further comprises a PIC detector 11 for detecting PIC or photo-induced current generated inside the LSI 6 due to the laser irradiation, and a PIC memory 14 for storing current values measured by the PIC detector 11.

The present system further comprises a frame memory 12 for storing three frames of R frame, G frame and B frame in order to produce an image signal from the PIC currents obtained by laser scannings of the surface of LSI 6 by using the galvano-mirror and polygon mirror 4 or X-Y stage 8. Thereby, by transferring data of the above-mentioned PIC memory 14 or data of other memory means, such as magnetic disk memory for storing data of PIC current which is preliminarily measured, the image signal is produced. Data of the PIC current stored in the frame memory 12 is output as R, G and B image signals to a color display 13 as brightness modulation image data corresponding to values of PIC current.

As a result of the above-mentioned configuration, by writing data of PIC current obtained by analysis of a good LSI, for instance, in G (green) frame memory 12, and on the other hand writing data of PIC current resulted by analysis of a fault LSI in R (red) frame memory 12, and images of PIC currents for the good LSI and fault LSI can be observed at the same time on the same color display in each other superposed state.

Figure 2:
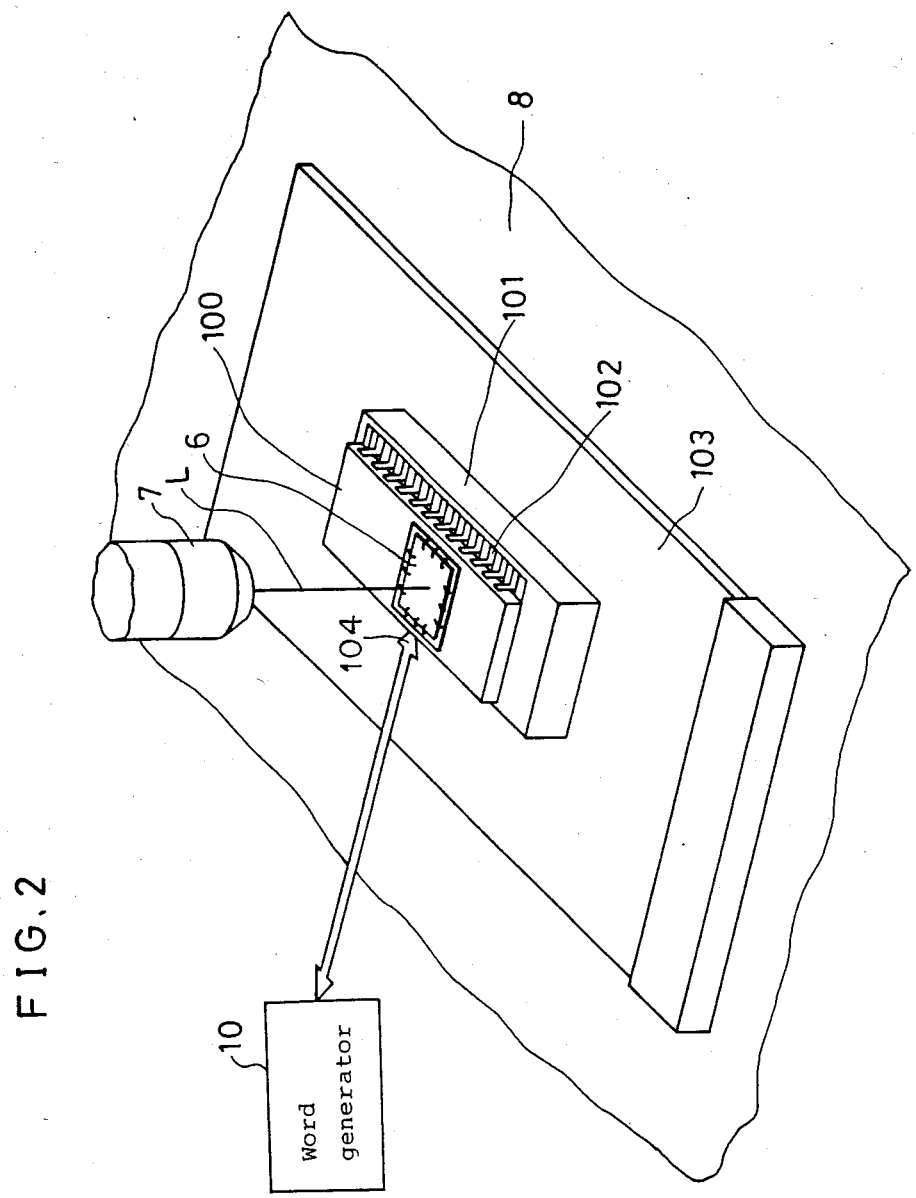
FIG. 2 is a perspective view showing irradiation of LSI by laser beam in the method of the present invention.

In FIG. 2, which is a perspective view of an LSI 6 and a means for scanning the laser beam L, the LSI 6 mounted to a package 101 is further inserted on a socket 101 to which terminals 102 of the package 101 are connected, and a holder 103 which holds the socket 101 is placed on the X-Y stage 8 shown in FIG. 1. Test input signal 104 from the word generator 10 is input through the socket 101 to predetermined terminals 102 of the LSI package, and the LSI is controlled in a predetermined operation states.

Figure 3:
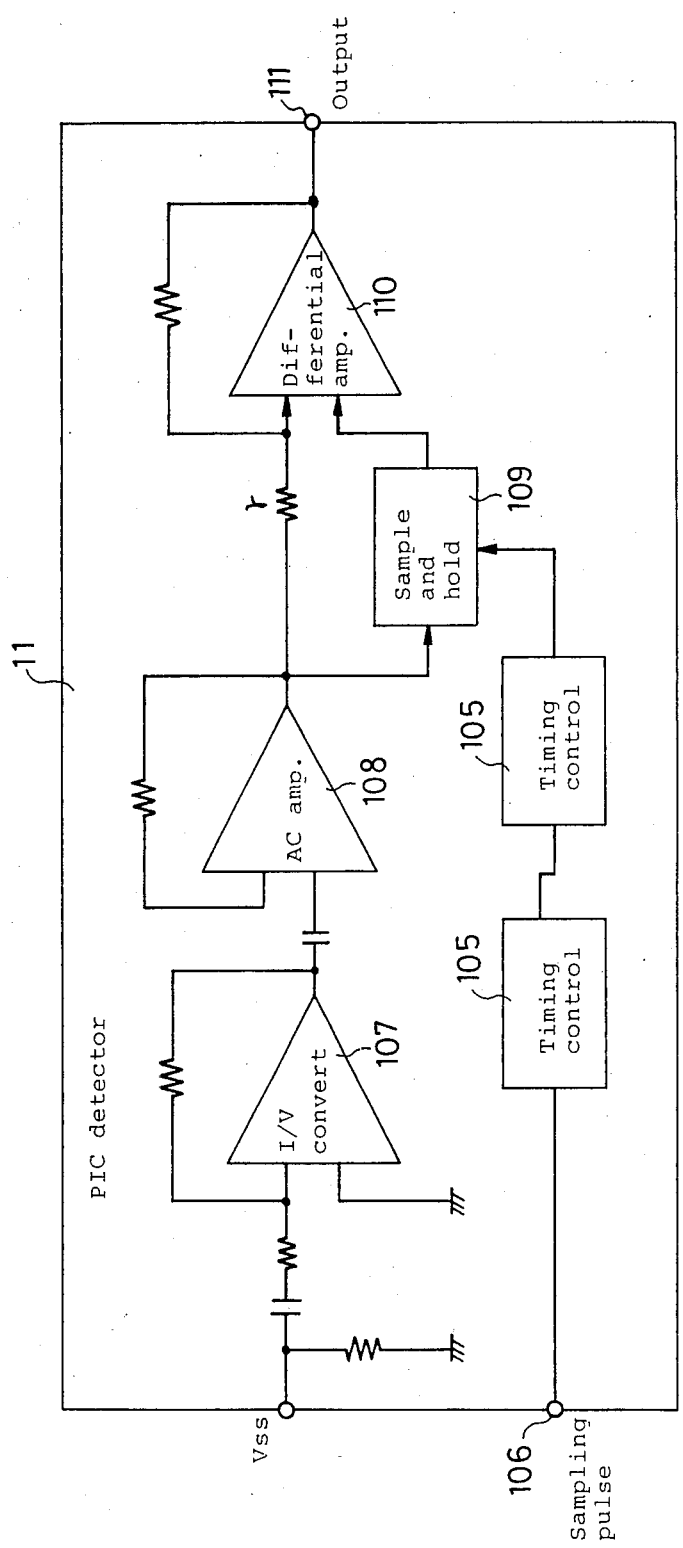
FIG. 3 is a block diagram of photo-induced current (PIC) detector 11 of FIG. 1.

FIG. 3 is a detailed block diagram of the PIC detector 11, wherein sampling pulses are impressed from an input terminal 106 through a timing control circuit 105 to a sample and hold circuit 109. The PIC detector 11 further has an I/V convert circuit 107 and an AC amplifier 108. An output of the AC amplifier 108 is inputted through a resistor r and through the sample and hold circuit 109 to a pair of input ends of a differential amplifier 110. The output of the differential amplifier 110 is issued an output terminal 111.

Figure 4:
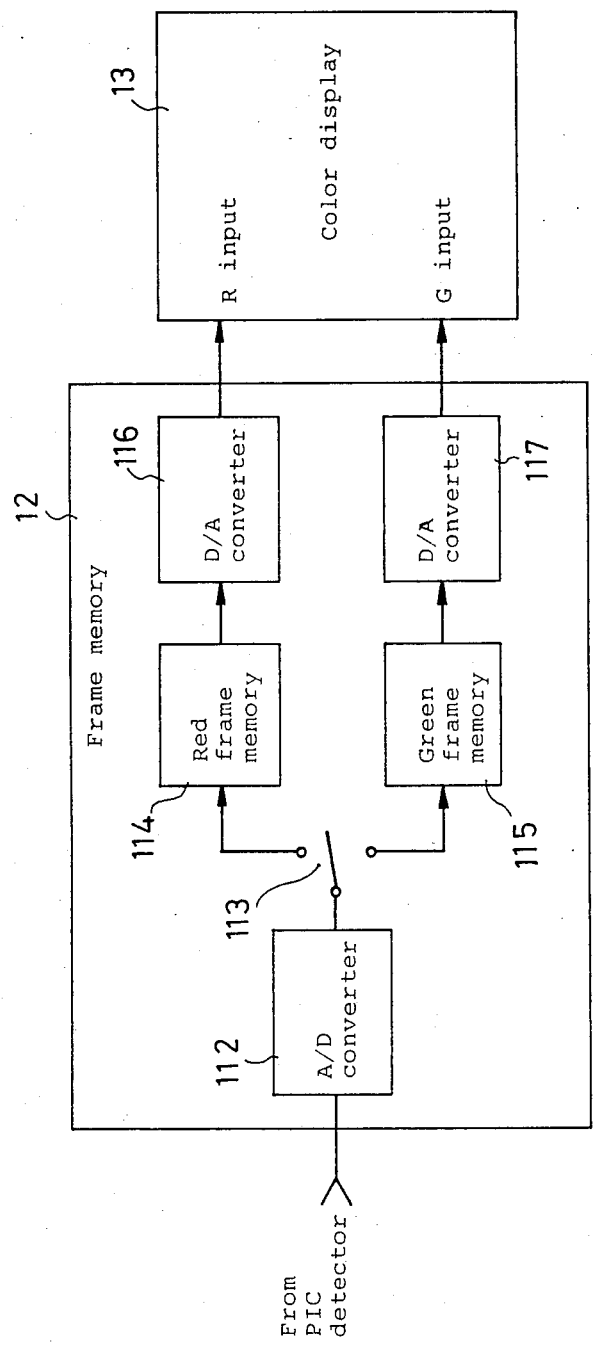
FIG. 4 is a block diagram of a frame memory 12 of FIG. 1.

FIG. 4 is a detailed block circuit of the frame memory 12, which comprises an A/D converter 112 for converting the PIC current from the PIC detector 11 to a digital signal, which is led through a change-over switch 113 to red frame memory 114 and green frame memory 115. Output signals of the red frame memory 114 and green frame memory 115 are D/A converted by a D/A converter 116 and a D/A converter 117, respectively, and further are given to R input terminal and G input terminal of the color display 13, respectively.

Figure 5:
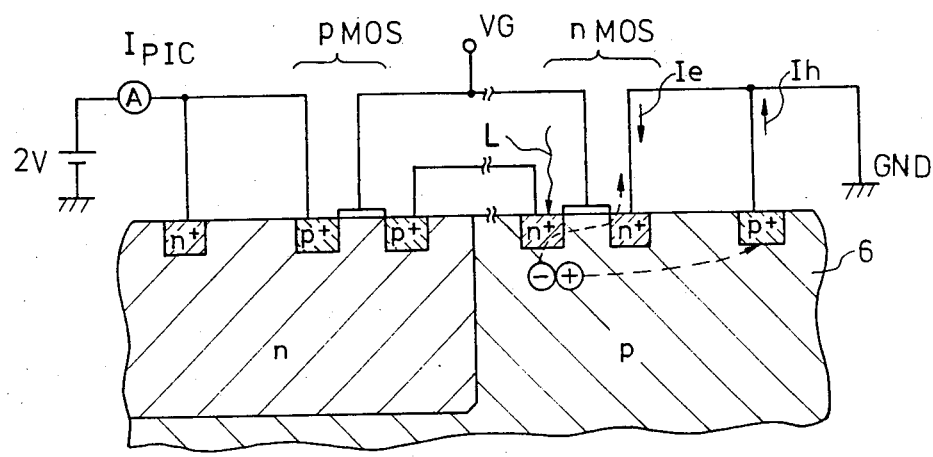
FIG. 5 is a circuit diagram for measuring a CMOS inverter.
Figure 6:
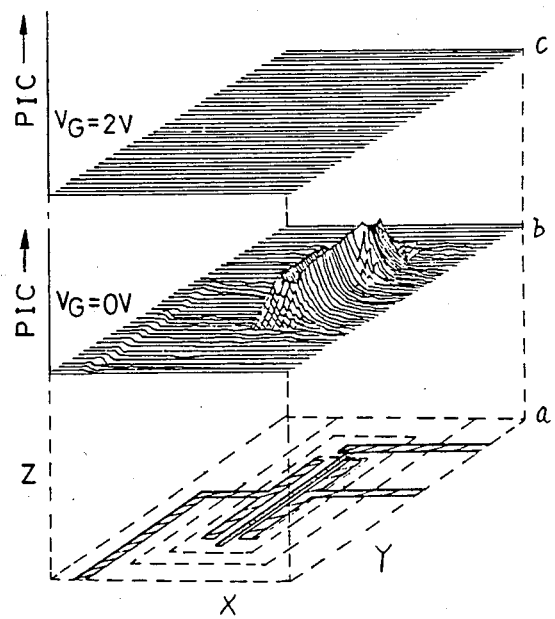
FIG. 6 is a chart showing results of measurements of an N-channel MOS-FET.

Next, the principle of examination or diagnosis of a large scale solid state device such as an LSI is described with reference to FIGS. 5 and 6. FIG. 5 shows a measurement circuit for a case of checking LSI 6 which includes CMOS inverter circuit consisting of n-channel MOS-FET and p-channel MOS-FET, and FIG. 6 shows an example of PIC measurement when n-channel MOS-FET regions of the CMOS inverter circuit are scanned by laser beam L. In FIG. 5, Ie and Ih show currents produced by electrons and holes induced by light of the scanning of laser beam L.

In FIG. 6, a pattern "a" shows a region scanned by the laser beam L, b and c respectively show results of PIC measurements when gate input voltage $V_G$ is 0 V and 2 V, wherein X axis and Y axis show X direction and Y direction of the laser scanning, and Z axis designate values of PIC at laser irradiated spots. As can be understood from the results of the PIC measurements, in case $V_G$ is 2 V, that is when the n-channel MOS-FET is on and p-channel MOS-FET is off, there are no increases of PIC in either of the source region, the drain region or gate region. On the other hand, in case $V_G$ is 0 V, that is, when n-channel MOS-FET is off and p- channel MOS-FET is on, a clear increase of PIC when the laser spot L scans on the gate region and drain region and thereabout is observed. The reason of the above-mentioned phenomena may be elucidated as follows.

Figure 7A:
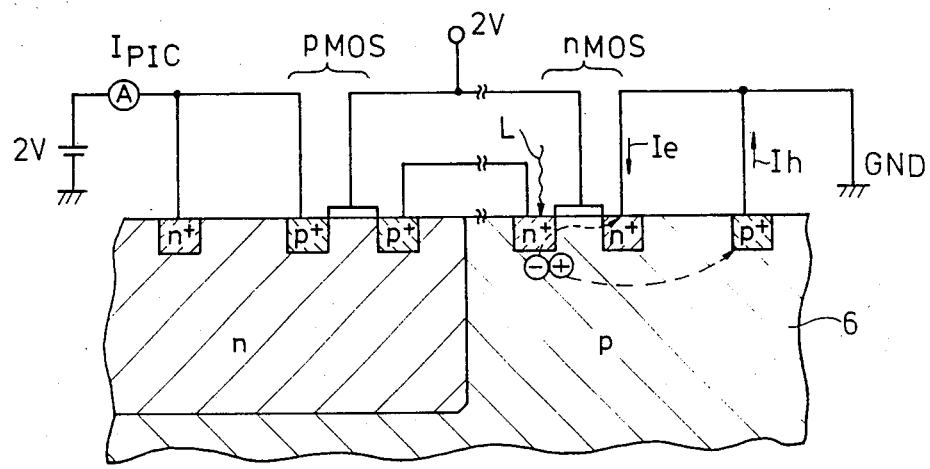
FIG. 7(a) and FIG. 7(b) are circuit diagrams for elucidation of principle of the present invention.

That is, in the case of FIG. 7(a) wherein a gate input voltage $V_G$ is 2 V and the laser beam irradiates the drain region of the n-channel MOS-FET, one part of the electrons $\ominus$ and holes $\oplus$ disappear due to recombination, but the remaining holes $\oplus$ flow by diffusion into the p+ GND terminal region, and supply a current Ih to the outside circuit. On the other hand, the electrons which do not disappear travel through a channel region of an n-channel MOS-FET of ON state, and therefore current Ie is supplied from outside. Since the n+ source region and the p+ GND region are short circuited by aluminum wiring, the actions by the electrons and holes are each other offset. Accordingly no PIC is detected from the source terminal or GND terminal.

Figure 7B:
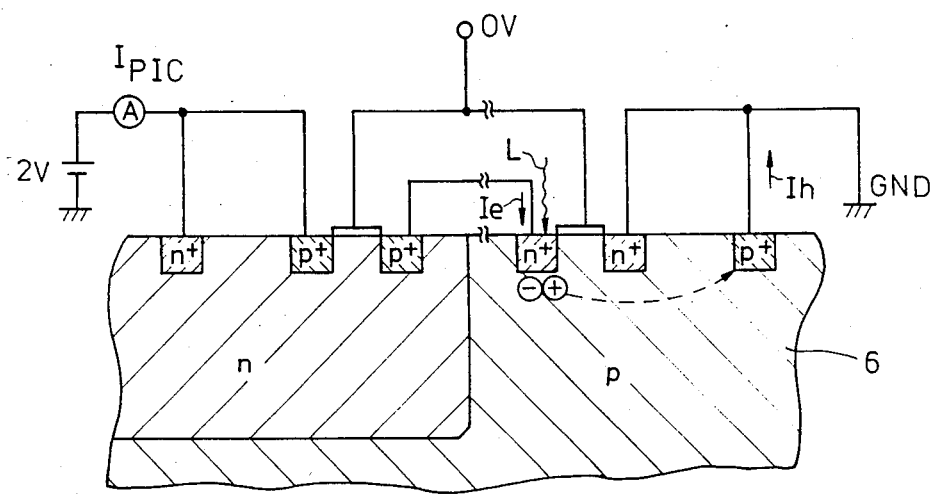

On the other hand, in the case of FIG. 7(b) wherein the gate input voltage $V_G$ is 0 V, the holes $\oplus$ flow into the p+ GND region, but electrons $\ominus$ act to draw current into the n+ drain region, since the n-channel MOS-FET is in OFF state. In such state, a current is supplied from the power source through p-channel MOS-FET to n+ drain region, and accordingly an increase of current is observed at the power source terminal.

As has been described, by measurement of PIC due to laser irradiation at the power source terminal or ground terminal, the states of ON or OFF of the FET can be examined. Accordingly, in the present invention, good or fault of solid state device can be examined by making displays of the PIC with specified colors and with brightness modulations on the same display screen or visual field, followed by comparing the displays of different colors.

Figure 8:
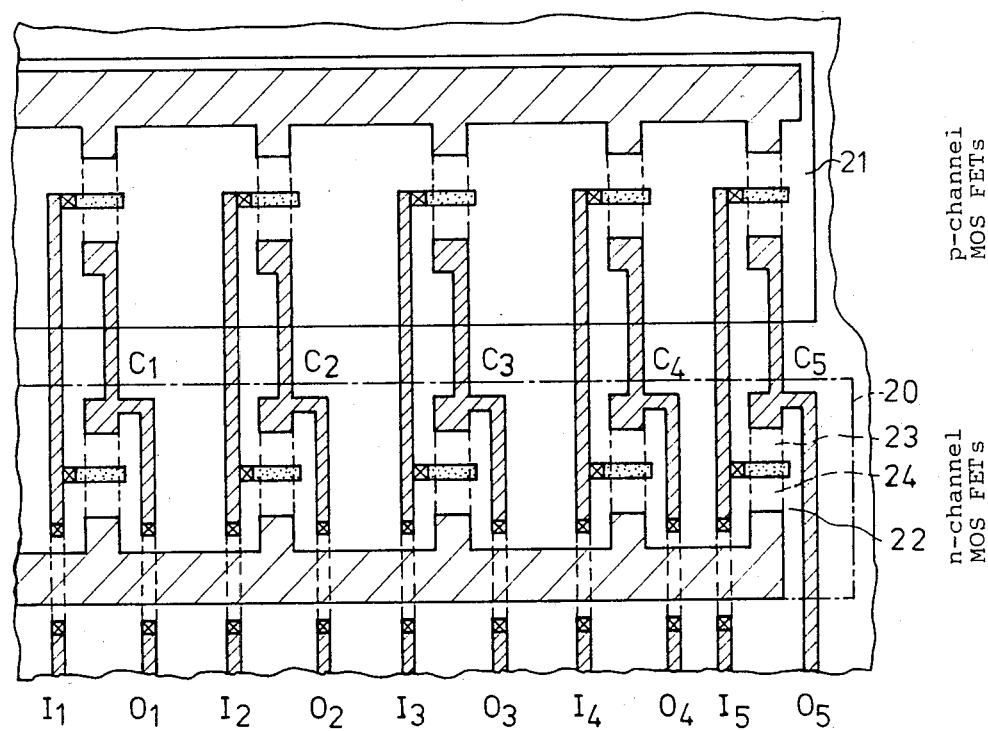
FIG. 8 is a small part of an LSI pattern.

Next, one example of fault analysis of LSI by application of the principle of the present invention is described with reference to FIGS. 8 and 9. FIG. 8 shows an enlarged plan view of a pattern configuration of a small part of the LSI on which the analysis is made. The LSI shown in FIG. 8 has inverter circuit parts $C_1$, $C_1$, $C_3$, $C_4$, $C_5$, ... and each inverter circuit comprises p-channel MOS-FET 21 and n-channel MOS-FET 22. The numerals 23 and 24 designate the drain region and the source region of the n-channel MOS-FET. Now, an elucidation is made on a case where the logic levels $I_1$, $I_2$, $I_3$, $I_4$, $I_5$ should be "10110" for a good LSI, and when the laser beam L scans a laser scanning region 20 encircled by a chain line.

Figure 9A:
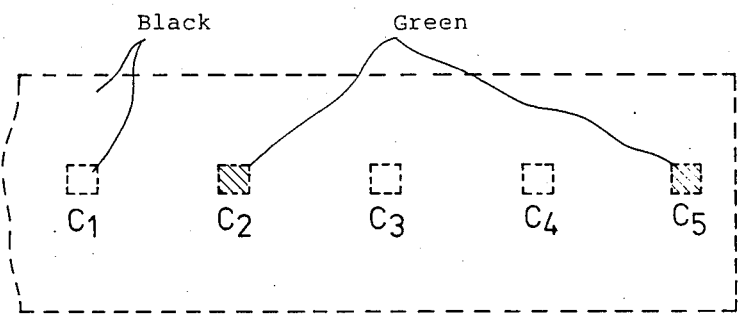
FIG. 9(a), FIG. 9(b) and FIG. 9(c) are plan views of parts of LSI for illustrations of display at an analyzation of fault on an LSI.

At first, when the laser scanning is made on a good LSI, when the laser beam is irradiated on the drain region of the n-channel MOS-FET 22 of the inverter circuit. Assuming the input logic level is "0", i.e., an n-channel MOS-FET 22 is OFF and a p-channel MOS-FET is ON, a PIC is detected from the power source terminal (not shown). Therefore, the image of the PIC shows high brightness parts for the parts corresponding to the drain regions 25 of the n-channel MOS-FETs of the inverter circuits $C_2$ and $C_5$ as shown in FIG. 9(a). In the embodiment, since the image of PIC of a good LSI is displayed by a green color, the drain regions 25 of the n-channel MOS-FETs of the inverters $C_2$ and $C_5$ become green, and other regions become black in the image.

Figure 9B:
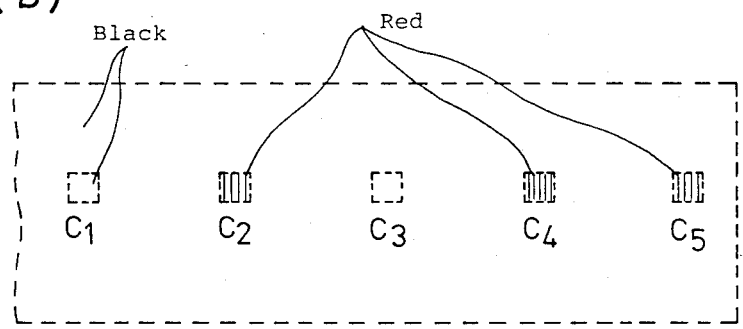

On the other hand, for a fault or object LSI wherein actual input logic levels of the input terminals $I_1$, $I_2$, $I_3$, $I_4$, $I_5$ are "10100" in the fault LSI, the PIC image of FIG. 9(b) is also made by scanning the laser beam in the similar manner to the aforementioned good LSI. In this case of the fault LSI, since the input logic level becomes "0", the brightness for the parts corresponding to the drain regions of the n-channel MOS-FET 22 of the inverters $C_2$, $C_4$, $C_5$ become high. Since the PIC image for the fault LSI is represented by a red color, the drain regions 25 of the faulted n-channel MOS-FETs of the inverters $C_2$, $C_4$ and $C_5$ become red and other remaining regions become black in the image.

If the IC or LSI have a very small scale and has a simple circuit configuration, the fault may be found by simply watching the image of the object LSI. But in an actual LSI wherein the scale of the circuit is very large and an area to scan by the laser beam is very wide, and has a complicated internal operation such a simple watching may be insufficient. If, only a simple watch is used to examine the PIC image, an accurate analysis of fault of the LSI by a simple comparison of the PIC images of a good LSI and an object LSI necessarily requires a very detailed knowledge of LSI internal configuration, and pattern disposition of the LSI. According to the present invention, however, by superposing images of PIC of the good LSI and object LSI by utilizing different color images, for the respective LSIs the above-mentioned difficulty of the conventional method is easily and completely dissolved.

Figure 9C:
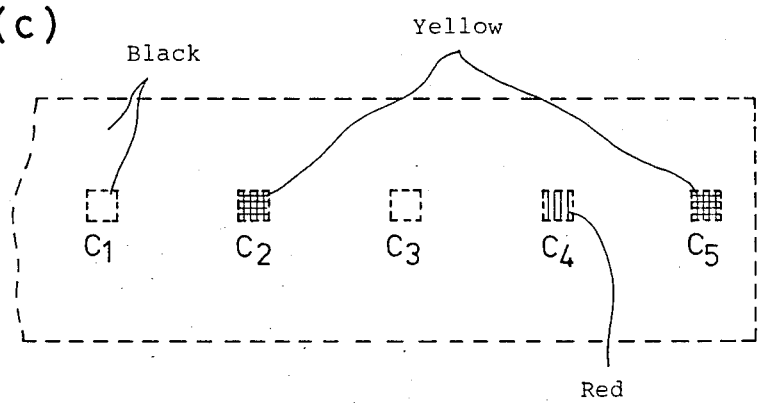

FIG. 9(c) shows one example of a part of the displayed images whereon PIC images of a good LSI in green and object LSI in red are displayed superposingly. As shown in FIG. 9(c), at the parts of FET where good LSI and fault LSI performing the same operations, the superposed light becomes yellow, which is a light composed of the combination of green light and red light faulted parts of the LSI, where malfunctions are found are displayed in red (no combination of light).

In the above-mentioned disclosure, the example is described for the case wherein input of the inverter circuit $C_4$ of the fault LSI is "0" as a result of the fault, but in a case where an input which should originally be "0" level makes an erroneous "1", the drain region of the n-channel MOS-FET corresponding thereto is represented black. Therefore, when both PIC images of the good LSI and object LSI are displayed superposingly at the same time, the parts of malfunction are represented in red color.

Apart from the above-mentioned example, other types of images can be used for the PIC image, as far as it is based on the PIC.

Next, elucidation is made for another embodiment of a solid-state device checking apparatus capable of a function to detect reflection lights from the surface of the solid state device by using laser light irradiation.

As shown in FIG. 10 and FIG. 11, the optical microscope 5 has a half mirror 501 between the objective lens 7 and a mirror 502 for bending light path of the incident light from the galvano-mirror 4. The incident light from the galvano-mirror 4 is irradiated on the LSI 6 and makes reflected light intensity thereof vary depending on regions of the LSI 6 by difference of reflectivity of the LSI 6. The reflected light is further reflected by the half mirror 501 and led to a reflection light detector 200 which outputs a signal corresponding to change of intensity of the reflected light. The output signal of the reflection light detector 200 is recorded in a frame memory of a third color, for instance, a blue frame memory 21 and the data of the blue frame memory 21 is given to an A/D converter 118 in the frame memory 12. The output signal of the A/D converter 118 is given to a blue frame memory 21, and the output of the latter is further given to a D/A converter 119, output of which is given through a brightness controller 120 to a blue input terminal B of the color display 13. Accordingly, the color display 13 shows a third image of blue color based on the optical image of the LSI 6. The brightness controller 120 controls the display of the blue image, for instance, to control its brightness to slowly flicker, thereby intermittently showing the optical image based on the reflection light, in a superposed manner on the composite color image based on the PICs of the good and object LSI. Since the reflection light from the surface of the LSI varies depending on the material of LSI and thickness of insulation film, etc., the third image based on the reflected light corresponds with the surface structure of the LSI. Since the above-mentioned third image produced from the reflected light shows the surface structure of the LSI, by utilizing the third image as the reference optical image of good LSI, and by intermittently superposing the image with the first image produced by the PIC obtained under the laser beam irradiation on the fault object LSI, the analyzation or diagnosis in accordance with the present invention can be performed more easily.

The important feature of the present invention is to use the composite color made by superposing the first image for the object LSI based on the PIC obtained under the laser beam scanning and the second image for the good LSI. By using such composite color resulted from superposition of the two images of different color, the points of fault, which must have different pattern in the image from the image of the good LSI, can be easily found as points of different color from other parts of the composite color.

The superposition of the first image of the first color and the second image of the second color may be made by inputting the first signal for the first color to one color modulating electrode of a CRT and inputting the second signal to the second color modulating electrode of the same CRT, thereby producing two different color images respectively for the two input signals; or alternatively, two images of the first color and the second color may be superposed in an optical system for instance by projecting two different images on one optical screen; or alternatively two images may be superposed by using, for instance, a half mirror by which the first image and the second image are composed for observation as one image; or alternatively two images of different colors may be time-sharingly displayed on the color display 13 with a quick switching to show the two color images so that two images are observed as one image by after image phenomenon of human eye; or still alternatively, the superposition may be made by overlapping an image based on difference of luminance of the first image and the second image with the optical image of the reflection light from the LSI 6 through the microscope 5 as a hypothetical superposition of the direct optical image of the reflection light and the electric display image of the difference of the luminance of the first and the second images.

What is claimed is:

1. A method of laser probing a solid-state device, comprising the steps of:
   irradiating a laser light beam as a first irradiation on desired regions of a solid-state device to be examined;
   producing a first image on a first color based on a first photo-induced current or PIC, induced by said first irradiation of said laser light beam on said desired regions;
   irradiating a laser light beam as a second irradiation on the corresponding regions of a reference solid-state device of substantially the same constitution as said solid-state device to be examined;
   producing a second image of a second color, different than said first color, based on a second PIC induced by said second irradiation of laser light beam on said corresponding regions; and
   superposingly displaying said first image and said second image in a manner that images of corresponding regions are superposed on each other, thereby to produce spot images of only one of the first or second color for regions on said solid-state device where said first PIC and said second PIC differ from each other therein, and to produce a color of display for other regions from said such regions on said solid-state device are of a composite color of the first color and the second color.

2. Laser probing in accordance with claim 1, comprising the further step of
   moving said solid-state device using an X-Y stage which makes a spot of irradiation of said laser light beam on said solid-state device fall on any desired part of said solid-state device.

3. Laser probing in accordance with claim 1, wherein said irradiating a first irradiation uses a light beam scanning device comprising a galvano mirror and a polygon mirror.

4. Laser probing in accordance with claim 1, comprising the further step of
   impressing a test signal on said solid-state device.

5. A method of laser probing a solid-state device, comprising the steps of:
   impressing an input signal on a semiconductor device to be examined;
   irradiating a laser light beam as a first irradiation on desired semiconductor regions of said semiconductor device to be examined while impressed with said input signal;
   producing a first image of a first color based on a first photo-induced current or PIC induced in said semiconductor device by said first irradiation of laser light beam on said desired regions and taken out from its external terminals;
   irradiating a laser light beam as a second irradiation on corresponding semiconductor regions of a reference semiconductor device of substantially the same constitution as said semiconductor device to be examined;
   producing a second image of a second color different from said first color based on a second PIC induced in said semiconductor device by said second irradiation of said laser light beam on said corresponding regions;
   superposingly displaying said first image and said second image in a manner that the image of said corresponding regions are superposed on each other, thereby to produce spot images of only one color which can be the first or second color, only for such regions on said semiconductor device where said first PIC and said second PIC differ each other therein, and to produce a color of display for other regions from said such regions on said semiconductor device of a composite color of the first color and the second color.

6. Laser probing in accordance with claim 5, comprising the further step of
moving said semiconductor device using an X-Y stage which makes a spot of irradiation of said laser light beam on said semiconductor device travel to any desired parts of said semiconductor device.

7. Laser probing in accordance with claim 5, wherein said irradiating a first radiation uses a light beam scanning device comprising a galvano mirror and polygon mirror.

8. Laser probing in accordance with claim 5, comprising the further step of
impressing a test signal on said semiconductor device.

9. Laser probing in accordance with claims 5, 6, 7 or 8, wherein
said semiconductor device includes a CMOS circuit.

10. Laser probing in accordance with claim 5, 6, 7 or 8, wherein
said PIC is detected at a power source terminal of said semiconductor device.

11. Laser probing in accordance with claim 5, 6, 7 or 8 wherein
said first color is red and said second color is green.

12. Laser probing in accordance with claim 5, 6, 7 or 8, comprising the further steps of
detecting reflection light from the surface of said semiconductor device; and
storing data of said reflection light, making correspondence with parts of said laser light irradiation.

13. Apparatus for laser probing a solid-state device comprising:
means for irradiating a laser light beam on desired regions on a surface of a solid-state device;
means for producing a signal by detecting photoinduced current or PIC induced in said solid-state device by said irradiation of said laser light beam;
frame memory means for storing and outputting a plurality of images based on said PIC;
display means for superposingly displaying said plurality of images, each said image being displayed in different colors, and an overlap of said images being displayed in a superposed color.

14. Apparatus for laser probing a solid-state device in accordance with claim 13,
further comprising an X-Y stage for mounting said solid-state device, and which makes a spot of irradiation of said laser light beam on said solid-state device occur at any desired parts of said solid-state device.

15. Apparatus for laser probing of a solid-state device in accordance with claim 13, further comprising
a light beam scanning device comprising a galvano mirror and polygon mirror.

16. Apparatus for laser probing of a solid-state device in accordance with claim 13, further comprising
a word generator for impressing a test signal on said solid-state device.

17. Apparatus for laser probing of a semiconductor device, comprising:
means for irradiating a laser light beam on desired semiconductor regions on the surface of said semiconductor device;
means for producing a signal by detecting a photo-induced current or PIC induced in said semiconductor device by said irradiation of said laser light beam;
frame memory means for storing and outputting a plurality of images including a first image and a second image based on said PIC; and
display means for superposingly displaying said plurality of images, each respective image displayed in a different color, and an overlap of said images being displayed in a superposed color.

18. Apparatus for laser probing of a semiconductor device in accordance with claim 17,
further comprising an X-Y stage disposed to mount said semiconductor device, and which makes a spot of irradiation of said laser light beam on said semiconductor device occur at any desired part of said semiconductor device.

19. Apparatus for laser probing of a semiconductor device in accordance with claim 17, further comprises
a light beam scanning device comprising a galvano mirror and polygon mirror.

20. Apparatus for laser probing of a semiconductor device in accordance with claim 17, further comprises
a word generator for impressing a test signal on said semiconductor device.

21. Apparatus for laser probing of a semiconductor device in accordance with claim 17, 18, 19 or 20, wherein
said semiconductor device comprises at least one CMOS circuit.

22. Apparatus for laser probing of a semiconductor device in accordance with claim 17, 18, 19 or 20, wherein
said PIC is detected at a power source terminal of said semiconductor device.

23. Apparatus for laser probing of a semiconductor device in accordance with claim 17, 18, 19 or 20, wherein
a first color is red and a second color is green.

24. Apparatus for laser probing of a semiconductor device in accordance with any of claims 17, 18, 19 or 20, which further comprises
means for detecting a reflection light from the surface of said semiconductor device; and
frame memory means for storing data of said reflection light in correspondence with portions of said laser light irradiation.

25. Apparatus for laser probing of a semiconductor device in accordance with claim 17, which further comprises
detecting means for detecting a reflection light from the surface of said semiconductor device, and
means for producing a third image by utilizing said reflection light.

26. Apparatus for laser probing of a semiconductor device in accordance with claim 25, wherein
said third image is superposed with one of said first image, said second image, and (c) a composite image of said first image and second image, but said third image has different color than any of said first image, second image and composite image.

27. A method for laser probe testing a solid-state device, comprising the steps of:
(a) irradiating a laser light onto a desired region of a reference solid-state device;
(b) detecting a reference photo-induced current in said reference semiconductor device;
(c) storing said reference photo-induced current as an image of a first color;
(d) irradiating laser light onto a desired region of an object solid-state device, said desired region of said object solid-state device corresponding to said desired region of said reference solid-state device;

(e) detecting an object photo-induced current in said object solid-state device; and (f) storing said object photo-induced current as an image of a second color different from said first color; and (g) displaying said first and second images in a superposed manner such that images of corresponding regions are superposed upon one another, so that images of only one color are produced where said detected photo-induced currents differ from one another, and an image of a superposed color between said first and second colors are displayed where said photo-induced currents correspond with one another.

28. A method as in claim 27 comprising the further step of impressing an input signal on said object solid-state device before detecting said object photo-induced current.

29. An apparatus as in claim 27 comprising the further step of repeatedly executing said steps (d) through (g).

30. An apparatus for laser probe testing a solid-state device, comprising:
means for irradiating a laser light onto a desired region of a solid-state device;
means for detecting a photo-induced current in said solid-state device;
means for storing said photo-induced current as an image of a predetermined color, a photo-induced current of a reference solid-state device being stored in a first color, as an image of a photo-induced current of an object solid-state device being stored in a second color; and
means for displaying said images in a superposed manner so that regions corresponding to areas where photo-induced currents do not correspond are displayed in only one color, and regions corresponding to areas where photo-induced currents do correspond are displayed in a color which is a combination of said first and second color.

31. Apparatus as in claim 30 comprising means for providing a signal input to said solid-state device during said irradiation.

32. A method of laser probing a solid-state device, comprising the steps of:
impressing an input signal on a semiconductor device to be examined;
irradiating a laser light beam as a first irradiation on desired semiconductor regions of said semiconductor device to be examined while impressed with said input signal;
producing a first image of a first color based on a first photo-induced current or PIC induced in said semiconductor device by said first irradiation of said laser light beam on said desired regions;
irradiating a laser light beam as a second irradiation on corresponding semiconductor regions of a reference semiconductor device of substantially the same constitution as said semiconductor device to be examined;
producing a second image of a second color different from said first color based on a second PIC induced in said semiconductor device by said second irradiation of said laser light beam on said corresponding regions;
superposingly displaying said first image and said second image in a manner that the image of said corresponding regions are superposed on each other, thereby to produce spot images of only one color which can be the first or second color, only for such regions on said semiconductor device where said first PIC and said second PIC differ each other therein, and to produce a color of display for other regions from said such regions on said semiconductor device of a composite color of the first color and the second color;
detecting a reflection light from the surface of said semiconductor device; and
producing superposingly displaying a third image by utilising said reflection light.

33. Laser probing in accordance with claim 32, wherein
said third image is superposed with one of: (a) said first image; (b) said second image and (c) said composite image of said first image and second image, and said third image is a different color from said first image, second image or composite image thereof.

* * * * *